(12) United States Patent
Utsumi

(10) Patent No.: US 6,876,147 B2
(45) Date of Patent: Apr. 5, 2005

(54) COLOR DISPLAY

(75) Inventor: Tetsuya Utsumi, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 48 days.

(21) Appl. No.: 10/617,110

(22) Filed: Jul. 9, 2003

(65) Prior Publication Data
US 2004/0007973 A1 Jan. 15, 2004

(30) Foreign Application Priority Data
Jul. 10, 2002 (JP) ........................................ 2002-200871

(51) Int. Cl.[7] .............................................. H01J 63/04
(52) U.S. Cl. ........................ 313/506; 313/503; 313/505; 313/512

(58) Field of Search ................................ 313/112, 498, 313/503, 505, 506, 512

(56) References Cited
FOREIGN PATENT DOCUMENTS

| JP | 10-255986 | 9/1998 | ........... H05B/33/26 |
|----|-----------|--------|----------------------|
| JP | 2000-48964 | 2/2000 | ........... H05B/33/22 |

Primary Examiner—Vip Patel
(74) Attorney, Agent, or Firm—Morgan & Finnegan

(57) ABSTRACT

A color display improves the contrast of a shown image without decreasing an open area ratio. A color electroluminescent display of the present invention has electroluminescent elements provided on a black insulation layer. A predetermined space exists between each adjacent pair of the electroluminescent elements. Filter elements are provided on the electroluminescent elements. The interface between each adjacent pair of the filter elements extends along the thickness direction of the color electroluminescent display and is aligned with one of the spaces.

17 Claims, 3 Drawing Sheets

COLOR DISPLAY

BACKGROUND OF THE INVENTION

The present invention relates to a color display such as a color liquid crystal display and a color electroluminescent display.

A prior art electroluminescent display 51 shown in FIG. 4 includes an electroluminescent layer 58, which contains an organic electroluminescent material. The organic electroluminescent material contained in the electroluminescent layer 58 is degraded when contacting oxygen and hydrogen. Therefore, the electroluminescent layer 58 is accommodated in a space defined by a substrate 52 and a sealing case 60. Getter agent 60a is provided in the sealing case 60. The getter agent 60a contains at least one of absorbent, desiccant, and oxygen adsorbent.

The electroluminescent layer 58 is provided between the transparent electrodes 57 and a metal electrode 59. The display 51 also includes thin film transistors 56. Each transparent electrode 57 is electrically connected to one of the thin film transistors 56. Therefore, parts of the electroluminescent layer 58 that correspond to the transparent electrodes 57 function as active matrix electroluminescent elements.

The electroluminescent display 51 includes a color filter 53. The color filter 53 includes filter elements 53b each of which changes white light to red light, green light, or blue light. Each filter element 53b is aligned with one of the transparent electrodes 57 with respect to the thickness direction of the electroluminescent display 51 (the vertical direction as viewed in FIG. 4). White light emitted from each electroluminescent element is changed to red light, green light, or blue light by the corresponding filter element 53b. The light is then outputted through a substrate 52.

To improve the contrast of a shown image, a black matrix 53a is generally provided between each adjacent pair of the filter elements 53b. However, the black matrixes 53a can decrease the open area ratio of the electroluminescent display 51. This is because the black matrixes 53a are often formed relatively large in consideration that each transparent electrode 57 may be displaced relative to the corresponding filter element 53b when the color filter 53 is mounted on the electroluminescent display 51.

Japanese Laid-Open Patent Publication No. 10-255986 discloses an electroluminescent display shown in FIG. 5. In the electroluminescent display of FIG. 5, an electroluminescent layer 58 is provided between transparent electrodes 57 and a translucent electrode 62. A conductive black layer 63 is provided at the back of the translucent electrode 62.

When a user looks at the electroluminescent display 51 of FIG. 4, light reflected by portions of the metal electrodes 59 corresponding to portions of the electroluminescent layer 58 emitting no light are within sight of the user. This makes it difficult for the user to view an image on the screen. In contrast to this, the electroluminescent display of FIG. 5 does not have such drawbacks. However, the black matrixes on the color filter can decrease the open area ratio.

Japanese Laid-Open Patent Publication No. 2000-48964 discloses an electroluminescent display shown in FIG. 6 and an electroluminescent display shown in FIG. 7. Each of the electroluminescent display has transparent electrodes 57, metal electrodes 59, and electroluminescent layers 58 located between the electrodes 57, 59. A black layer 63 is provided at the back of the metal electrodes 59. In the electroluminescent display of FIG. 7, an auxiliary electrode 65 is provided at each of the metal electrodes 59.

In the electroluminescent displays shown in FIGS. 6 and 7, parts of the black layer 63 corresponding to each adjacent pair of the electroluminescent layers 58 function as black matrixes. Therefore, unlike a case where separately formed black matrixes are provided on a color filter, the open area ratio is not decreased due to the black matrixes. However, the electroluminescent displays shown in FIGS. 6 and 7 are of a bottom emission type, which outputs light emitted by the electroluminescent layer 58 through the substrate 52. The substrate 52 therefore must be of a light transmittance type. Compared to a top emission structure in which light emitted by the electroluminescent layer 58 is outputted without passing through the substrate 52, the bottom emission structure is likely to decrease the opening area ratio.

SUMMARY OF THE INVENTION

Accordingly, it is an objective of the present invention to provide a color display that improves the contrast of a shown image without decreasing an open area ratio.

To achieve the foregoing and other objectives and in accordance with the purpose of the present invention, a color display including a base plate, a dark color layer, a plurality of electroluminescent elements, a plurality of active elements, a plurality of color control portions, and a screen is provided. The dark color layer is provided on the base plate. The electroluminescent elements are located on the dark color layer and are arranged in a matrix. A predetermined space exists between each adjacent pair of the electroluminescent elements. Each active element corresponds to one of the electroluminescent elements, and selectively switches the corresponding electroluminescent element between a light-emitting state and a non-light-emitting state. The color control portions are provided on the electroluminescent elements. Each color control portion is aligned with one of the electroluminescent elements along a thickness direction of the color display. When receiving light from the corresponding electroluminescent element, each color control portion controls the color of the received light and then emits the light. The interface between each adjacent pair of the color control portions is aligned with the space between an adjacent pair of the electroluminescent elements along the thickness direction of the color display. The screen is provided on the color control portions. Light outputted from the color control portions is outputted through the screen to show an image on the screen.

The present invention provides another color display, which includes a base plate, a dark color layer, a plurality of liquid crystal elements, a reflecting portion, a plurality of color control portions, and a screen. The dark color layer is provided on the base plate. The plurality of liquid crystal elements are located on the dark color layer and are arranged in a matrix. A predetermined space exists between each adjacent pair of the liquid crystal elements. The reflecting portion is provided between the dark color layer and the liquid crystal elements. The reflecting portion reflects light that reaches the reflecting portion. The color control portions are provided on the liquid crystal elements. Each color control portion is aligned with one of the liquid crystal elements along a thickness direction of the color display. When receiving light that has passed through the corresponding liquid crystal element, each color control portion controls the color of the received light and then emits the light. The interface between each adjacent pair of the color control portions is aligned with the space between an adjacent pair of the liquid crystal elements along the thickness direction of the color display. The screen is provided on the color control portions. Light outputted from the color control portions is outputted through the screen to show an image on the screen.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the present invention will now be described with reference to FIGS. 1 and 2.

Figure 1:
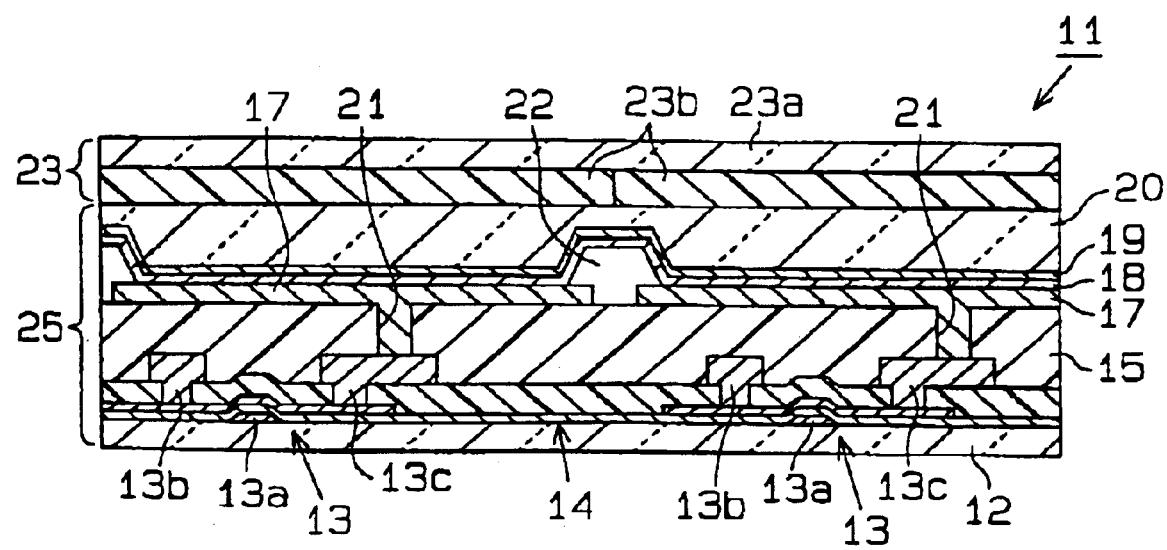
FIG. 1 is a cross-sectional view illustrating a section of the color electroluminescent display according to a first embodiment of the present invention.
Figure 2:
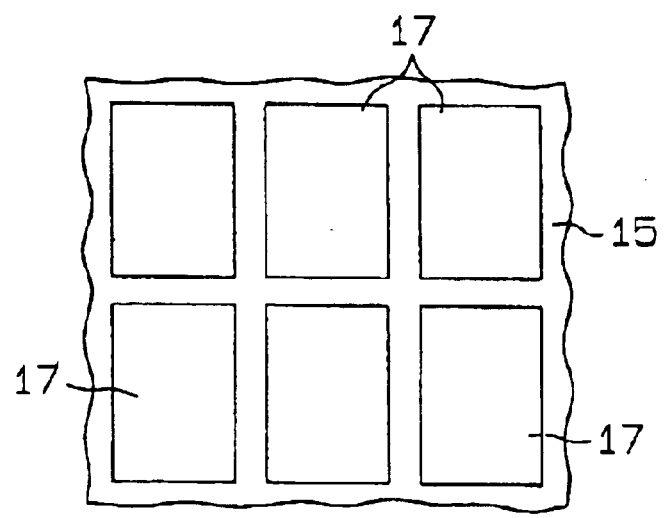
FIG. 2 is a plan view showing a part of the color electroluminescent display shown in FIG. 1.

A color electroluminescent display 11 shown in FIG. 1 has an array substrate 25 and a color filter 23 located on the array substrate 25. The array substrate 25 includes a base plate 12, a circuit layer 14, an insulation layer 15, pixel electrodes 17, an electroluminescent layer 18, a transparent electrode 19, and a passivation film 20.

The base plate 12 can be made of glass. The circuit layer 14 is located on a surface of the base plate 12 that faces the color filter 23, and includes thin film transistors 13. The thin film transistors 13 function as active elements. The thin film transistors 13 are located on a surface of the base plate 12 that faces the color filter 23. The thin film transistors 13 are evenly distributed and are arranged in a matrix. Each thin film transistor 13 has a gate electrode 13a, a source electrode 13b, and a drain electrode 13c.

The insulation layer 15, which functions as a dark color layer, is located on a surface of the circuit layer 14 that faces the color filter 23. The insulation layer 15 is of an electrical insulating type and can be made of a light curing resin. The insulation layer 15 is blackened with a pigment or a dye. Contact holes 21 are formed in the insulation layer 15. Each contact hole 21 is located at a position corresponding to one of the drain electrodes 13c. The surface of the insulation layer 15 facing the color filter 23 is flat.

The pixel electrode 17, which functions as an anode, is located on a surface of the insulation layer 15 that faces the color filter 23. Each pixel electrode 17 is aligned with one of the thin film transistors 13 along the thickness direction of the color electroluminescent display 11 (the vertical direction as viewed in FIG. 1). Each pixel electrode 17 is electrically connected to the drain electrode 13c of the corresponding thin film transistor 13 through one of the contact holes 21. Each pixel electrode 17 is a rectangular plate made of chromium (see FIG. 2) and reflects light. A predetermined space exists between each adjacent pair of the pixel electrodes 17. Each space is filled with a joint 22. The joints 22 are of a light transmittance type and can be made of synthetic resin.

The electroluminescent layer 18 is provided on surfaces of the pixel electrodes 17 that face the color filter 23 and on surfaces of the joints 22 that face the color filter 23. The electroluminescent layer 18 contains an organic electroluminescent material. The electroluminescent layer 18 includes, for example, a hole injection layer, an illuminating layer, and an electron injection layer. Those layers are arranged in this order from the side facing the pixel electrodes 17 toward the color filter 23. Parts of the electroluminescent layer 18 that correspond to the pixel electrodes 17 function as active matrix electroluminescent elements that emit white light. The electroluminescent layer 18 is of a light transmittance type.

The transparent electrode 19, which functions as an opposing electrode, is located on a surface of the electroluminescent layer 18 that faces the color filter 23. The transparent electrode 19 also functions as a cathode. The transparent electrode 19 is of a light transmittance type and can be made of indium tin oxide.

The passivation film 20 is provided on a surface of the transparent electrode 19 that faces the color filter 23. The passivation film 20 is of a light transmittance type and can be made of silicon nitride, silicon oxide, or diamond-like carbon. The passivation film 20 blocks water, thereby sealing the electroluminescent layer 18.

The color filter 23 is located on a surface of the passivation film 20 that faces away from the transparent electrode 19. A surface of the color filter 23 that faces away from the array substrate 25 functions as a screen for displaying an image.

The color filter 23 includes a transparent plate 23a and filter elements 23b. The filter elements 23b function as color control portions. The transparent plate 23a is of a light transmittance type and can be made of glass. The peripheral portions of the transparent plate 23a and the base plate 12 are bonded together with adhesive. The filter elements 23b are made of organic material and are provided on a surface of the transparent plate 23a that faces the array substrate 25. Each filter element 23b changes white light into red light, green light, or blue light. Each filter element 23b is aligned with one of the pixel electrodes 17 along the thickness direction of the color electroluminescent display 11. The interface between each adjacent pair of the filter elements 23b extends along the thickness direction of the color electroluminescent display 11 and is aligned with the corresponding joint 22.

When manufacturing the color electroluminescent display 11, the circuit layer 14 and the insulation layer 15 are consecutively formed on the base plate 12. Then, the contact holes 21 are formed in the insulation layer 15 at positions corresponding to the drain electrodes 13c. Subsequently, chromium is sputtered onto the insulation layer 15 to form a chromium film on the insulation layer 15. Thereafter, unnecessary portion of the chromium film is removed through photolithography. Accordingly, the pixel electrodes 17 are formed on the insulation layer 15. Then, the joints 22 are formed between each adjacent pair of the pixel electrodes 17. Next, the electroluminescent layer 18, the transparent electrode 19, the passivation film 20 are consecutively formed on the pixel electrodes 17 and the joints 22. The array substrate 25 is thus formed. Finally, the color filter 23 is mounted on the array substrate 25. The color electroluminescent display 11 is thus obtained.

An operation of the color electroluminescent display 11 will now be described.

When voltage is applied to one of the thin film transistors 13 and the thin film transistor 13 is ON, voltage is applied to the corresponding pixel electrode 17. At this time, if voltage is applied to the transparent electrode 19, part of the electroluminescent layer 18 that correspond to the pixel electrode 17 emits white light. The emitted light is converted into red light, green light, or blue light by the filter element 23b of the filter 23 and is then outputted from a side of the color filter 23 that faces away from a side facing the array substrate 25.

The first embodiment provides the following advantages.

In the color electroluminescent display 11 shown in FIG. 1, parts of the insulation layer 15 corresponding to spaces between each adjacent pair of the pixel electrodes 17 function as black matrixes. Therefore, although no black matrixes are provided on the color filter 23, the color electroluminescent display 11 shows an image with a favorable contrast. That is, the color electroluminescent display 11 shows an image with a favorable contrast without a decrease of the open area ratio which would be caused if separately formed black matrixes were provided on the color filter 23.

The color filter 23 is easy to manufacture compared to a color filter having black matrixes.

The pixel electrodes 17, the electroluminescent layer 18, and the transparent electrode 19 are located on the flat surface of the insulation layer 15 that faces the color filter 23. This structure prevents short circuits from being established between the pixel electrodes 17 and the transparent electrode 19. If the pixel electrodes 17, the electroluminescent layer 18, and the transparent electrode 19 are formed on an uneven surface, short circuits are often established between the pixel electrodes 17 and the transparent electrode 19.

The circuit layer 14 including the thin film transistors 13 are located on the surface of the substrate, and the pixel electrodes 17 are located on the insulation layer 15. In other words, the thin film transistors 13 and the pixel electrodes 17 are not in the same plane. Compared to a case where the thin film transistors 13 and the pixel electrodes 17 are located in the same plane in the base plate 12, the ratio of the area occupied by the pixel electrodes 17 is increased on the base plate 12. In other words, the ratio of area that functions as electroluminescent elements is increased in the entire electroluminescent layer 18.

If parts of the electroluminescent layer 18 that correspond to the pixel electrodes 17 emit light other than white light, for example, emit blue light, the color filter 23 will have to be replaced by color converting portions of a more complicated structure. However, since the parts of the electroluminescent layer 18 emit white light, the color filter 23 need not be replaced by such color converting portions.

The electroluminescent layer 18 is sealed with the passivation film 20. Therefore, the color electroluminescent display 11 is thinner compared to a case where the electroluminescent layer 18 is sealed with a transparent case made of glass or synthetic resin.

The color filter 23, which is made of an organic material, has a superior color reproduction characteristics compared to a color filter made of an inorganic material.

Light emitted by the electroluminescent layer 18 outputted through the color filter 23 without passing through the base plate 12. That is, the color electroluminescent display 11 of FIG. 1 has a top emission structure and not a bottom emission structure. This prevents a decrease of the open area ratio due to a bottom emission structure. Also, since the base plate 12 and the pixel electrodes 17 need not be of a light transmittance type, the top emission structure adds to the flexibility of the materials for the base plate 12 and the pixel electrodes 17.

The pixel electrodes 17 reflect light. Therefore, compared to a case where the pixel electrodes 17 do not reflect light, for example, a case where the pixel electrodes 17 are transparent, the amount of light outputted through the color filter 23 is increased.

Parts of the electroluminescent layer 18 that correspond to the pixel electrodes 17, or the electroluminescent elements, are driven by an active driving system. Compared to a case where the electroluminescent elements are driven by a passive driving system, crosstalk among the electroluminescent elements is suppressed.

Figure 4:
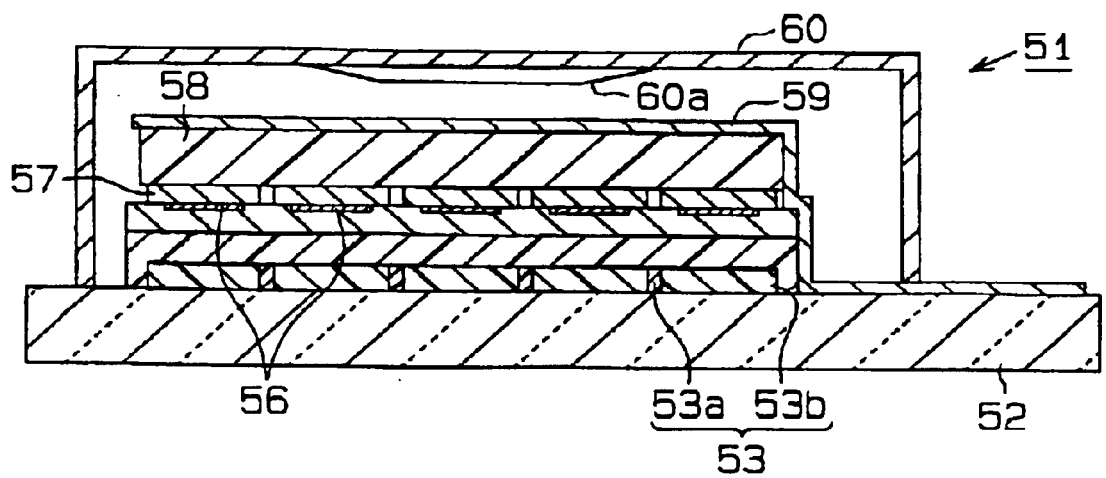
FIG. 4 is a cross-sectional view illustrating a section of the prior art electroluminescent display.
Figure 5:
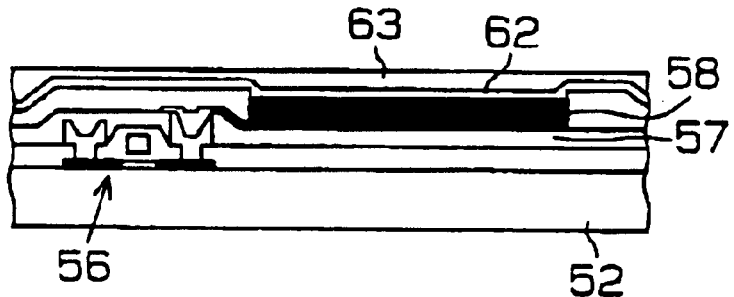
FIG. 5 is a diagrammatic view showing a section of another prior art electroluminescent display.
Figure 6:
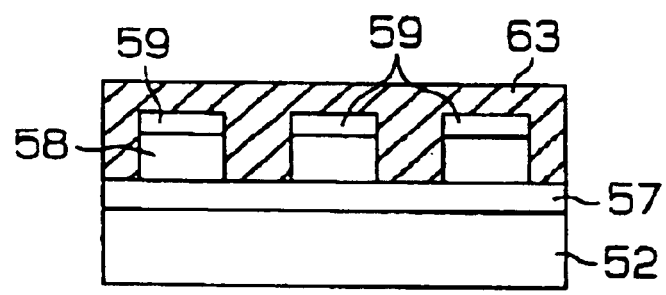
FIG. 6 is a cross-sectional view showing a section of the further prior art electroluminescent display.
Figure 7:
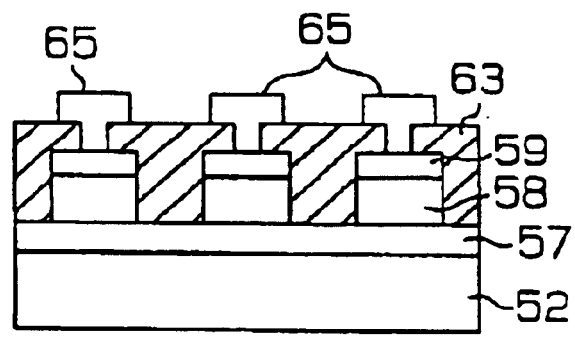
FIG. 7 is a cross-sectional view showing yet a section of another prior art electroluminescent display.

In the prior art electroluminescent display 51 shown in FIG. 4, the thin film transistors 56 are located on the color filter 53. However, since heat generated when forming the thin film transistors 56 can damage the color filter 53, a dedicated facility for preventing the color filter 53 from being damaged is required when forming the thin film transistors 56. In contrast to this, the thin film transistors 13 of the color electroluminescent display 11 shown in FIG. 1 are located not on the color filter 23, but on the base plate 12. Therefore, heat generated when the thin film transistors 13 are being formed scarcely damages the color filter 23. Thus, no dedicated facility is required.

A predetermined space exists between each adjacent pair of the pixel electrodes 17. Therefore, when the color filter 23 is attached to the color electroluminescent display 11, the filter elements 23b are prevented from being misaligned with respect to the pixel electrodes 17. The distance between each adjacent pair of the pixel electrodes 17 is preferably greater than errors produced when the color filter 23 is attached to the color electroluminescent display 11.

A second embodiment of the present invention will now be described with reference to FIG. 3.

Figure 3:
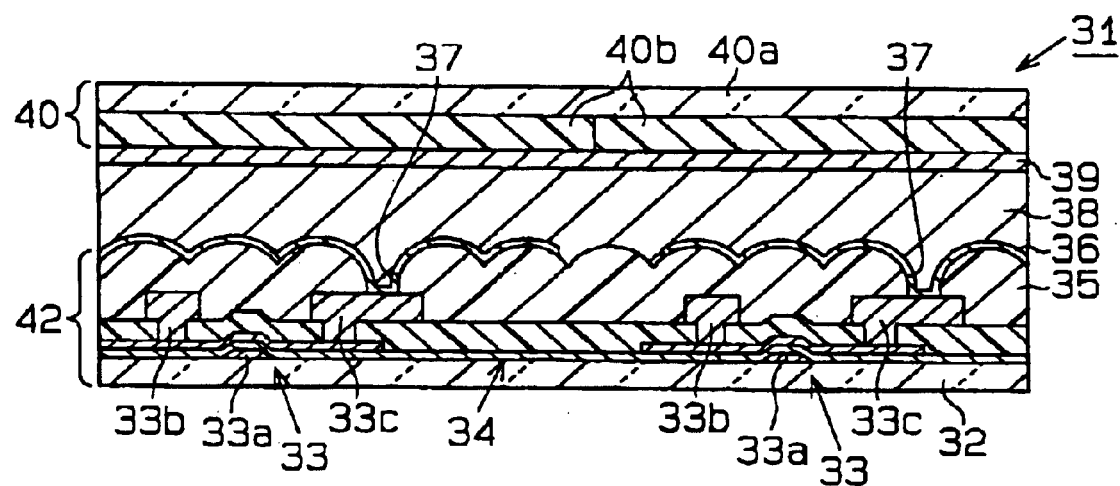
FIG. 3 is a cross-sectional view showing a section of the color liquid crystal display according to a second embodiment.

A color liquid crystal display 31 shown in FIG. 3 has an array substrate 42, a liquid crystal layer 38 located on the array substrate 42, a transparent electrode 39, a color filter 40, and a polarizing plate (not shown). The array substrate 42 includes a base plate 32, a circuit layer 34, an insulation layer 35 and pixel electrodes 36.

The base plate 32 can be made of glass. The circuit layer 34 is located on a surface of the base plate 32 that faces the color filter 40, and includes thin film transistors 33. The thin film transistors 33 function as active elements. The thin film transistors 33 are located on a surface of the base plate 32 that faces the color filter 40. The thin film transistors 33 are evenly distributed and are arranged in a matrix. Each thin film transistor 33 has a gate electrode 33a, a source electrode 33b, and a drain electrode 33c.

The insulation layer 35 is located on a surface of the circuit layer 34 that faces the color filter 40. The insulation layer 35 is of an electrical insulating type and can be made of a light curing resin. The insulation layer 35 is blackened with a pigment or a dye. Contact holes 37 are formed in the insulation layer 35. Each contact hole 37 is located at a position corresponding to one of the drain electrodes 33c. The surface of the insulation layer 35 facing the color filter 40 is wavy.

The pixel electrodes 36 are located on a surface of the insulation layer 35 that faces the color filter 40. The surface of each pixel electrode 36 facing the color filter 40 is wavy. Each pixel electrode 36 is aligned with one of the thin film transistors 33 along the thickness direction of the color liquid crystal display 31 (the vertical direction as viewed in FIG. 3). Each pixel electrode 36 is electrically connected to the drain electrode 33c of the corresponding thin film transistor 33 through one of the contact holes 37. Each pixel electrode 36 is an rectangular plate made of chromium and reflects light. A predetermined space exists between each adjacent pair of the pixel electrodes 36.

The liquid crystal layer 38 is located on a surface of the pixel electrodes 36 that face the color filter 40, or on the surface of the array substrate 42 that faces the color filter 40. Parts of the liquid crystal layer 38 that correspond to the pixel electrodes function as active matrix liquid crystal elements.

The transparent electrode 39, which functions as an opposing electrode, is located on a surface of the liquid crystal layer 38 that faces the color filter 40. The transparent electrode 39 is of a light transmittance type and can be made of indium tin oxide.

The color filter 40 is located on a surface of the transparent electrode 39 that faces away from the liquid crystal layer 38. The color filter 40 includes a transparent substrate 40a and filter elements 40b. The filter elements 40b function as color control portions. The transparent substrate 40a is of a light transmittance type and can be made of glass. The filter elements 40b are made of organic material and are provided on a surface of the transparent substrate 40a that faces the liquid crystal layer 38. Each filter element 40b changes white light into red light, green light, or blue light. Each filter element 40b is aligned with one of the pixel electrodes 36 along the thickness direction of the color liquid crystal display 31. The interface between each adjacent pair of the filter elements 40b extends along the thickness direction of the color liquid crystal display 31 and is aligned with spaces between each adjacent pair of the pixel electrodes 36.

The polarizing plate (not shown) is located on a surface of the transparent substrate 40a that is facing away from the liquid crystal layer 38. A surface of the polarizing plate that faces away from the liquid crystal layer 38 functions as a screen for displaying an image.

When manufacturing the color liquid crystal display 31, the circuit layer 34 and the insulation layer 35 are consecutively formed on the base plate 32. Then, the contact holes 37 are formed in the insulation layer 35 at positions corresponding to the drain electrodes 33c. Subsequently, chromium is sputtered onto the insulation layer 35 to form a chromium film on the insulation layer 35. Thereafter, unnecessary portion of the chromium film is removed through photolithography. Accordingly, the pixel electrodes 36 are formed on the insulation layer 35. The array substrate 42 thus manufactured is then mounted on the color filter 40. The transparent electrode 39 is provided on the filter elements 40b of the color filter 40 in advance. The peripheral portions of the array substrate 42 and the color filter 40 are bonded together with sealing agent such that a predetermined space exists between the array substrate 42 and the color filter 40. Thereafter, the space between the array substrate 42 and the color filter 40 is filled with liquid crystal to form the liquid crystal layer 38. Finally, the polarizing plate is attached to the transparent substrate 40a. The color liquid crystal display 31 is thus obtained.

An operation of the color liquid crystal display 31 will now be described.

When voltage is applied to one of the thin film transistors 33 and the thin film transistor 33 is ON, voltage is applied to the corresponding pixel electrode 36. At this time, if voltage is applied to the transparent electrode 39, part of the liquid crystal layer 38 that correspond to the pixel electrode 36 is changed to block transmission of light. The outside light reflected by the pixel electrodes 36 passes through part of the liquid crystal layer 38 that permits light to pass through, and is converted into red light, green light, or blue light by the filter clement 40b of the color filter 40. The light is then outputted through the polarizing plate.

The second embodiment provides the following advantages.

In the color liquid crystal display 31 shown in FIG. 3, parts of the insulation layer 35 corresponding to spaces between each adjacent pair of the pixel electrodes 36 function as black matrixes. Therefore, although no black matrixes are provided on the color filter 40, the color liquid crystal display 31 shows an image with a favorable contrast. That is, the color liquid crystal display 31 shows an image with a favorable contrast without a decrease of the open area ratio which would be caused if separately formed black matrixes were provided on the color filter 40.

The color filter 40 is easy to manufacture compared to a color filter having black matrixes.

The surface of each pixel electrode 36 facing the color filter 40 is wavy. Therefore, outside light that enters the color liquid crystal display 31 is efficiently reflected by the surface of the pixel electrodes 36 that face the color filter 40.

The circuit layer 34 including the thin film transistors 33 are located on the surface of the base plate 32, and the pixel electrodes 36 are located on the insulation layer 35. In other words, the thin film transistors 33 and the pixel electrodes 36 are not in the same plane. Compared to a case where the thin film transistors 33 and the pixel electrodes 36 are located on the same surface of the base plate 32, the ratio of the area occupied by the pixel electrodes 36 is increased on the base plate 32. In other words, the ratio of area that functions as liquid crystal elements is increased in the entire liquid crystal layer 38.

Light reflected by the pixel electrodes 36 is outputted through the color filter 40 without passing through the base plate 32. That is, the color liquid crystal display 31 of FIG. 3 has a top emission structure and not a bottom emission structure. This prevents a decrease of the open area ratio due to a bottom emission structure. Also, since the base plate 32 and the pixel electrodes 36 need not be of a light transmittance type, the top emission structure adds to the flexibility of the materials for the base plate 32 and the pixel electrodes 36.

Parts of the liquid crystal layer 38 that correspond to the pixel electrodes 36, or the liquid crystal elements, are driven by an active driving system. Compared to a case where liquid crystal elements are driven by a passive driving system, crosstalk among the liquid crystal elements is suppressed.

The thin film transistors 33 of the color liquid crystal display 31 shown in FIG. 3 are located not on the color filter 40, but on the base plate 32. Therefore, heat generated when the thin film transistors 33 are being formed scarcely damages the color filter 40.

A predetermined space exists between each adjacent pair of the pixel electrodes 36. Therefore, when the color filter 40 is attached to the color liquid crystal display 31, the filter elements 40b are prevented from being misaligned with respect to the pixel electrodes 36. The distance between each adjacent pair of the pixel electrodes 36 is preferably greater than errors produced when the color filter 40 is attached to the color liquid crystal display 31.

It should be apparent to those skilled in the art that the present invention may be embodied in many other specific forms without departing from the spirit or scope of the invention. Particularly, it should be understood that the invention may be embodied in the following forms.

The pixel electrodes 17 shown in FIG. 1 may be transparent or translucent. This prevents a shown image from being degraded by light reflection of the pixel electrodes 17.

The pixel electrodes 17 of FIG. 1 and the pixel electrodes 36 of FIG. 3 may be made of metal other than chromium.

In the color electroluminescent display 11 shown in FIG. 1, the pixel electrodes 17 need not be directly mounted on a surface of the insulation layer 15 that faces the color filter 23. For example, a transparent intervening layer may be provided between the insulation layer 15 and the pixel electrodes 17. In the color liquid crystal display 31 shown in FIG. 3, the pixel electrodes 36 need not be directly mounted on a surface of the insulation layer 35 that faces the color filter 40. For example, a transparent intervening layer may be provided between the insulation layer 35 and the pixel electrodes 36.

The electroluminescent layer 18 of FIG. 1 may be replaced by an electroluminescent layer that emits blue light. In this case, the color filter 23 may be replaced by color converting portions that emit red or green fluorescence by blue light. Alternatively, such color converting portions may be located between the electroluminescent layer 18 and the color filter 23. In the former case, the color converting portion functions as a color control portion. In the latter case, the filter element 23b of the color filter 23 and the color converting portion function as a color control portion. However, the electroluminescent layer 18, which emits white light, simplifies a structure for obtaining the three primary colors of light compared to an electroluminescent layer that emits blue light.

The electroluminescent layer 18 may be replaced by an electroluminescent layer that has red light emitting portions, blue light emitting portions, and green light emitting portions. In this case, the filter elements 23b of the color filter 23 function as color control portions but do not convert the color of light emitted by the light emitting portions.

The insulation layer 15 of FIG. 1 and the insulation layer 35 of FIG. 3 may be made of a synthetic resin other than light curing resin. For example, the insulation layers 15, 35 may be made of a thermosetting resin. The insulation layer 15, 35 may be a dark color other than black. For example, the insulation 15, 35 may be brown or indigo blue.

The transparent plate 23a of FIG. 1 and the transparent substrate 40a of FIG. 3 may be made of a synthetic resin.

The base plate 12 of FIG. 1 and the base plate 32 of FIG. 3 may be opaque. The base plates 12, 32 may have flexibility or no flexibility. The base plates 12, 32 may be formed of ceramics, metal or synthetic resin.

The passivation film 20 of FIG. 1 may be replaced by a transparent case made of glass or synthetic resin.

The electroluminescent elements of the color electroluminescent display 11 shown in FIG. 1 may be replaced by electroluminescent elements driven by a passive drive system. That is, the circuit layer 14 may be omitted, the pixel electrodes 17 may be replaced by parallel pixel electrodes, and the transparent electrode 19 may be replaced by parallel transparent electrodes that are perpendicular pixel electrodes.

The liquid crystal elements of the color liquid crystal display 31 shown in FIG. 3 may be replaced by liquid crystal elements driven by a passive drive system. That is, the circuit layer 34 may be omitted, the pixel electrodes 36 may be replaced by parallel pixel electrodes, and the transparent electrode 39 may be replaced by parallel transparent electrodes that are perpendicular pixel electrodes.

In the color electroluminescent display 11 shown in FIG. 1, the pixel electrodes 17 may function as cathodes, and the transparent electrode 19 may function as an anode. In the color liquid crystal display 31 shown in FIG. 3, the pixel electrodes 36 may function as cathodes, and the transparent electrode 39 may function as an anode.

As long as the passivation film 20 of FIG. 1 blocks water and oxygen and transmits light, the passivation film 20 may be made of a material other than silicon nitride, silicon oxide, and diamond-like carbon.

In the color electroluminescent display 11 shown in FIG. 1, the thin film transistors 13 and the pixel electrodes 17 may be located in the same plane.

The thin film transistors 13 of FIG. 1 and the thin film transistors 33 of FIG. 3 may be replaced by active elements other than think film transistors. For example, the thin film transistors 13, 33 may be replaced by metal-insulator-metal (MIM) elements.

The pixel electrodes 17 of FIG. 1 and the pixel electrodes 36 of FIG. 3 may be quadrangles other than rectangles. For example, the pixel electrodes 17, 36 may be squares, parallelograms, or trapezoids. Further, the pixel electrodes 17, 36 may be polygons other than rectangles. For example, the pixel electrodes 17, 36 may be triangles or hexagons. Alternatively, the pixel electrodes 17, 36 may be non-polygons such as circles or ellipses. Further, the pixel electrodes 17, 36 may be irregular shapes. However, the pixel electrodes 17, 36 preferably have symmetrical polygons.

The present examples and embodiments are to be considered as illustrative and not restrictive and the invention is not to be limited to the details given herein, but may be modified within the scope and equivalence of the appended claims.

What is claimed is:

1. A color display, comprising:

a base plate;

a dark color layer provided on the base plate;

a plurality of electroluminescent elements, which are located on the dark color layer and are arranged in a matrix, wherein a predetermined space exists between each adjacent pair of the electroluminescent elements;

a plurality of color control portions provided on the electroluminescent elements, wherein each color control portion is aligned with one of the electroluminescent elements along a thickness direction of the color display, wherein, when receiving light from the corresponding electroluminescent element, each color control portion controls the color of the received light and then emits the light, and wherein the interface between each adjacent pair of the color control portions is aligned with the space between an adjacent pair of the electroluminescent elements along the thickness direction of the color display; and a screen provided on the color control portions, wherein light outputted from the color control portions is outputted through the screen to show an image on the screen.

2. The color display according to claim 1, further comprising a plurality of active elements, wherein each active element corresponds to one of the electroluminescent elements, and wherein each active element selectively switches the corresponding electroluminescent element between a light-emitting state and a non-light-emitting state.

3. The color display according to claim 2, further comprising a plurality of pixel electrodes and an opposing electrode, wherein each electroluminescent element is located between one of the pixel electrodes and the opposing electrode, and wherein each pixel electrode is electrically connected with one of the active elements.

4. The color display according to claim 3, wherein the opposing electrode is closer to the screen than the pixel electrodes and is of a light transmittance type.

5. The color display according to claim 3, wherein the pixel electrodes and the active elements are located in different planes.

6. The color display according to claim 5, wherein the dark color layer is located between the active elements and the pixel electrodes and has a plurality of contact holes, and wherein each active element is electrically connected to the corresponding pixel electrode through one of the contact holes.

7. The color display according to claim 1, further comprising a passivation film provided on the electroluminescent elements, wherein the passivation film seals the electroluminescent elements.

8. The color display according to claim 1, wherein, when emitting light, the electroluminescent elements emit white light.

9. A color display, comprising:

a base plate;

a dark color layer provided on the base plate;

a plurality of liquid crystal elements, which are located on the dark color layer and are arranged in a matrix, wherein a predetermined space exists between each adjacent pair of the liquid crystal elements;

a reflecting portion provided between the dark color layer and the liquid crystal elements, wherein the reflecting portion reflects light that reaches the reflecting portion;

a plurality of color control portions provided on the liquid crystal elements, wherein each color control portion is aligned with one of the liquid crystal elements along a thickness direction of the color display, wherein, when receiving light that has passed through the corresponding liquid crystal element, each color control portion controls the color of the received light and then emits the light, and wherein the interface between each adjacent pair of the color control portions is aligned with the space between an adjacent pair of the liquid crystal elements along the thickness direction of the color display; and a screen provided on the color control portions, wherein light outputted from the color control portions is outputted through the screen to show all image on the screen.

10. The color display according to claim 9, wherein a surface of the reflecting portion that faces the liquid crystal elements is wavy.

11. The color display according to claim 9, further comprising a plurality of active elements, wherein each active element corresponds to one of the liquid crystal elements, and wherein each active element selectively switches the corresponding liquid crystal element between a light-transmitting state and a light-blocking state.

12. The color display according to claim 11, further comprising a plurality of pixel electrodes and an opposing electrode, wherein each liquid crystal element is located between one of the pixel electrodes and the opposing electrode, and wherein each pixel electrode is electrically connected with one of the active elements.

13. The color display according to claim 12, wherein the opposing electrode is closer to the screen than the pixel electrodes and is of a light transmittance type.

14. The color display according to claim 13, wherein the pixel electrodes are located between the dark color layer and the liquid crystal elements and function as the reflecting portion.

15. The color display according to claim 12, wherein the pixel electrodes and the active elements are located in different planes.

16. The color display according to claim 15, wherein the dark color layer is located between the active elements and the pixel electrodes and has a plurality of contact holes, and wherein each active element is electrically connected to the corresponding pixel electrode through one of the contact holes.

17. The color display according to claim 12, wherein a surface of each pixel electrode that faces the corresponding liquid crystal element is wavy.

* * * * *

UNITED STATES PATENT AND TRADEMARK OFFICE
CERTIFICATE OF CORRECTION

PATENT NO. : 6,876,147 B2
DATED : April 5, 2005
INVENTOR(S) : Tetsuya Utsumi

It is certified that error appears in the above-identified patent and that said Letters Patent is hereby corrected as shown below:

Column 10,
Line 32, please delete "think film" and insert therefore -- thin film --.

Column 12,
Line 14, please delete "show all image" and insert therefore -- show an image --.

Signed and Sealed this

Sixth Day of September, 2005

JON W. DUDAS
*Director of the United States Patent and Trademark Office*